United States Patent
Kim et al.

(10) Patent No.: US 9,846,036 B2
(45) Date of Patent: Dec. 19, 2017

(54) ANGULAR VELOCITY SENSOR

(71) Applicant: Samsung Electro-Mechanics Co., Ltd., Suwon-Si (KR)

(72) Inventors: Jong Woon Kim, Suwon-Si (KR); Won Han, Suwon-Si (KR); Jong Hyeong Song, Suwon-Si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 145 days.

(21) Appl. No.: 14/940,651

(22) Filed: Nov. 13, 2015

(65) Prior Publication Data

US 2016/0138920 A1    May 19, 2016

(30) Foreign Application Priority Data

Nov. 14, 2014  (KR) .................. 10-2014-0158803
Apr. 7, 2015   (KR) .................. 10-2015-0048932

(51) Int. Cl.
  *G01P 15/08*    (2006.01)
  *G01C 19/5733*  (2012.01)
  *B81B 3/00*     (2006.01)
  *G01P 15/097*   (2006.01)

(52) U.S. Cl.
  CPC ........ *G01C 19/5733* (2013.01); *B81B 3/0051* (2013.01); *B81B 3/0062* (2013.01); *G01P 15/097* (2013.01); *G01P 2015/084* (2013.01); *G01P 2015/0822* (2013.01)

(58) Field of Classification Search
  CPC  G01C 19/56; G01C 19/5719; G01C 19/5733; G01C 19/5783; G01P 15/02; G01P 15/08; G01P 2015/0805; G01P 2015/0808; G01P 2015/082; G01P 2015/0822; G01P 2015/084; G01P 2015/0848; G01P 15/097; B81B 3/0035; B81B 3/0051; B81B 3/0062; B81B 2201/0235; B81B 2201/0242; B81B 2203/058
  USPC .............. 73/504.02, 504.12, 514.01, 514.02, 73/514.16, 514.24
  See application file for complete search history.

(56) References Cited

U.S. PATENT DOCUMENTS

| | | | |
|---|---|---|---|
| 6,439,050 B1* | 8/2002 | Musalem | G01C 19/5719 73/504.12 |
| 2011/0146404 A1 | 6/2011 | Jeung et al. | |
| 2013/0068018 A1* | 3/2013 | Seeger | G01C 19/5712 73/504.12 |

(Continued)

*Primary Examiner* — Benjamin Schmitt
(74) *Attorney, Agent, or Firm* — NSIP Law

(57) ABSTRACT

There is provided an angular velocity sensor including first and second mass bodies provided within a first frame, a first flexible connector system connecting the first and second mass bodies and the first frame and that includes at least one sensor to detect displacements of the first and second mass bodies, a second flexible connector system connecting the first frame to a second frame provided separate from the first frame and that includes a driver to drive movement of the first frame relative to the second frame, so angular velocities can be measured based on the first and second mass bodies being enabled to rotate in a first axis direction and translated in a second axis direction, and based on the first frame being flexibly connected to the second frame so that a rotation displacement of the first frame is made in a third axis direction.

28 Claims, 9 Drawing Sheets

(56) References Cited

U.S. PATENT DOCUMENTS

2014/0069189 A1* 3/2014 Kim .................. G01C 19/5642
                                                    73/514.02
2014/0182375 A1* 7/2014 Kim .................. G01C 19/5712
                                                    73/504.12

* cited by examiner

ANGULAR VELOCITY SENSOR

CROSS-REFERENCE TO RELATED APPLICATION

This application claims the benefit of Korean Patent Application Nos. 10-2014-0158803 and 10-2015-0048932, respectively filed on Nov. 14, 2014 and Apr. 7, 2015, which are hereby incorporated by reference in their entirety.

BACKGROUND

1. Field

One or more embodiments relates to an angular velocity sensor.

2. Description of Related Art

Recently, angular velocity sensors have been used in various fields, for example, the military, such as an artificial satellite, a missile, an unmanned aircraft, or the like, vehicles, such as an air bag, electronic stability control (ESC), a black box for a vehicle, or the like, hand shaking prevention of a camcorder, motion sensing of a mobile phone or a game machine, navigation, or the like.

An angular velocity sensor may generally adopt a configuration in which a mass body is adhered to an elastic substrate such as a membrane, or the like, in order to measure an angular velocity through interaction of the mass body and the substrate. Through the configuration, the angular velocity sensor may calculate the angular velocity by measuring a Coriolis force applied to the mass body.

In detail, a scheme of measuring the angular velocity using the angular velocity sensor is as follows. First, the angular velocity may be measured based on the Coriolis force "F=2mΩv", where "F" represents the Coriolis force acting on the mass body, "m" represents the mass of the mass body, "Ω" represents the angular velocity to be measured, and "v" represents the motion velocity of the mass body. Among others, since the motion velocity v of the mass body and the mass m of the mass body may be values known in advance, the angular velocity Ω may be derived by detecting the Coriolis force (F) acting on the mass body.

Accordingly, in an example where the angular velocity sensor includes a piezoelectric material disposed on a membrane (a diaphragm) in order to drive a mass body or sense displacement of the mass body adhered to the membrane, the angular velocity. It may be desirable to allow a resonant frequency of the corresponding driving mode and a resonant frequency of the corresponding sensing mode to substantially coincide with each other.

SUMMARY

One or more embodiments provide an angular velocity sensor, including a first mass body and a second mass body, a first frame, a first flexible connector system connecting the first mass body and the second mass body to the first frame and including a sensor configured to detect displacement of one or more of the first mass body and the second mass body, a second frame provided separate from the first frame, and a second flexible connector system connecting the first frame and the second frame and including a driver configured to drive movement of the first frame with respect to the second frame, wherein the first mass body and the second mass body are flexibly connected to the first frame by the first flexible connector system to enable the first mass body and the second mass body to rotate in a first axis direction and translate in a second axis direction different from the first axis direction, and the first frame is flexibly connected to the second frame by the second flexible connector system to enable rotation displacement of the first frame, relative to the second frame, in a third axis direction different from the first and second axis directions.

The first flexible connector system may limit rotation displacements of the first mass body and the second mass body in the second and third axis directions and limit translation displacements of the first mass body and the second mass body in the first and third axis directions, with respect to the first frame.

The second flexible connector system may limit rotation displacements of the first frame in the first and second axis directions and limit translation displacements of the first frame in the first and third axis directions, with respect to the second frame.

The first flexible connector system may further include first flexible connectors flexibly connecting the first mass body and the second mass body, respectively, to the first frame and configured as beams so as to enable respective bending displacements of the first mass body and the second mass body, with respect to the first frame, and second flexible connectors flexibly connecting the first mass body and the second mass body, respectively, to the first frame and having link structures so as to enable respective twisting displacements and rotation displacements of the first mass body and the second mass body, with respect to the first frame.

The second flexible connectors having link structures may include first hinges connected to the first mass body and the second mass body, respectively, so that rotation displacements of the first mass body and the second mass body are made, arms connected to respective first hinge portions of the first hinges and extending in directions different from a direction in which the first hinges are connected to the first mass body and the second mass body, second hinge portions of the first hinges being connected to the first mass body and the second mass body, respectively, second hinges connected to respective first side portions of the arms so that respective rotation displacements of the arms are made, second side portions of the arms being connected to the first hinge portions of the first hinges, respectively, and fixed arms connecting respective first hinge portions of the second hinges and the first frame, second hinge portions of the second hinges being connected to the first side portions of the arms, respectively.

The second flexible connectors having link structures may include first hinges connected to the first mass body and the second mass body, respectively, so that rotation displacements of the first mass body and the second mass body are made, arms connected to respective first hinge portions of the first hinges and extending in directions different from a direction in which the first hinges are connected to the first mass body and the second mass body, second hinge portions of the first hinges being connected to the first mass body and the second mass body, respectively, and second hinges connected to respective first side portions of the arms so that respective rotation displacements of the arms are made and so to respectively link the second hinges to the first frame, second side portions of the arms being connected to the first hinge portions of the first hinges, respectively.

The second flexible connectors may further include a coupling hinge connecting the first mass body and the second mass body.

The second hinge portions of the first hinges may respectively connect to center portions of the first mass body and the second mass body.

The first hinges and the second hinges may be disposed in parallel and the arms are disposed to be orthogonal to the first hinges and the second hinges.

A connection direction in which the first hinges respectively connect to the first mass body and the second mass body may be orthogonal to a direction in which a flexible connector of the second flexible connector system connects the first frame and the second frame.

The second flexible connector system may include a first flexible connector connecting the first frame and the second frame and configured as a beam so as to enable a bending displacement of the first frame, with respect to the second frame, and include a second flexible connector connecting the first frame and the second frame and configured as a hinge so as to enable a twisting displacement of the first frame, relative to the second frame.

The first mass body and the second mass body may be symmetrically arranged within the first frame and disposed relative to the second flexible connector system so that the first mass body and the second mass body translate in different directions along the second axis when the first frame rotates based on the third axis.

The first axis direction may be an X-axis direction, the second axis direction a Z-axis, and the third axis direction is Y-axis direction.

The first flexible connector system may include first flexible connectors configured as beams respectively connected to the first mass body and the second mass body in the Y-axis direction, second flexible connectors respectively connected to the first mass body and the second mass body in the X-axis direction, and one of the second flexible connectors having a link structure that includes a first hinge including a first hinge portion connected to one of the first mass body and the second mass body in the X-axis direction, an arm including a first side portion connected to a second hinge portion of the first hinge and extending in the Y-axis direction, and a second hinge including a first hinge portion connected to a second side portion of the arm in the X-axis direction, and a second hinge portion arranged so as to link the second hinge to the first frame.

The first flexible connector system may include first flexible connectors configured as beams respectively connected to the first mass body and the second mass body in the Y-axis direction, and second flexible connectors respectively connected to the first mass body and the second mass body in the X-axis direction, and one of the second flexible connectors having a link structure may include a first hinge including a first hinge portion connected to one of the first mass body and the second mass body in the X-axis direction, an arm including a first side portion connected to a second hinge portion of the first hinge and extending in the Y-axis direction, a second hinge including a first hinge portion connected to a second side portion of the arm in the X-axis direction, and a fixed arm including a first side portion connected to a second hinge portion of the second hinge and a second side portion connected to the first frame in the Y-axis direction.

The second flexible connector system may include a first flexible connector configured as a beam and to connect the first frame and the second frame in the X-axis direction, and a second flexible connector configured as a hinge and to connect the first frame and the second frame in the Y-axis direction.

One or more embodiments provide an angular velocity sensor, including a first mass body and a second mass body symmetrically arranged with respect to each other and with respect to a first frame of the angular velocity sensor, a sensing unit including flexible connectors configured to flexibly connect the first mass body and the second mass body so that the first mass body and the second mass body are each enabled to independently and respectively rotate about a first axis and to translate along a same direction and configured to detect displacements of the first mass body and the second mass body, and a driving unit configured to support the first mass body and the second mass body so that the first mass body and the second mass body are enabled to collectively displace and rotate in a second axis direction and configured to drive movement of the first and second mass bodies.

The sensing unit may further include a sensor configured to detect the displacements of the first mass body and the second mass body, first flexible connectors respectively connected to the first mass body and the second mass body and configured as beams to enable respective bending displacements of the first mass body and the second mass body, and second flexible connectors respectively connected to the first mass body and the second mass body and having link structures to enable respective twisting deformations and respective rotation displacements of the first mass body and the second mass body.

One of the second flexible connectors may include a first hinge including a first hinge portion connected to one of the first mass body and the second mass body to enable a corresponding rotation displacement of the first mass body or the second mass body, an arm including a first side portion connected to a second hinge portion of the first hinge and having an extending direction different from a direction in which the first hinge connects to the first mass body or the second mass body, and a second hinge connected to a second side portion of the arm to enable rotation displacement of the arm.

One of the second flexible connectors may include a first hinge including a first hinge portion connected to one of the first mass body and the second mass body to enable a corresponding rotation displacement of the first mass body or the second mass body, an arm including a first side portion connected to a second hinge portion of the first hinge and having an extending direction different from a direction in which the first hinge connects to the first mass body or the second mass body, a second hinge including a first hinge portion connected to a second side portion of the arm to enable rotation displacement of the arm, and a fixed arm connecting a second hinge portion of the second hinge to the driving unit.

The angular velocity sensor may further include a coupling hinge connecting the first mass body and the second mass body.

The driving unit may further include the first frame flexibly connected to the sensing unit, the first mass body and the second mass body being symmetrically arranged within the first frame, a second frame provided separate from the first frame, and a flexible connector system flexibly connecting the first frame and the second frame and including a vibration driver element.

The flexible connector system may include a first flexible connector connecting the first frame and the second frame and configured as a beam to enable a bending displacement of the first frame with respect to the second frame, and include a second flexible connector connecting the first frame and the second frame and configured as a hinge to enable a twisting displacement of the first frame with respect to the second frame.

One or more embodiments provide an angular velocity sensor, including a first frame, a first mass body and a second mass body arranged within the first frame, a first flexible connector system connecting the first and second mass bodies and the first frame and including a sensor configured to detect displacement of at least one of the first mass body and the second mass body, a second frame provided separate from the first frame, a second flexible connector system connecting the first frame and the second frame and including a driver configured to drive movement of the first frame relative to the second frame, wherein the second flexible connector system flexibly connects the first frame and the second frame to enable the first frame to rotate based on a Y axis with respect to the second frame, the driver is configured to enable rotation of the first frame based on the Y axis and a surface including the Y axis is positioned to be different from a surface at which a center of gravity of the first and second mass bodies is positioned with respect to a Z-axis direction, respective centers of gravity of the first and second mass bodies are positioned on opposite sides of an axis corresponding to the rotating of the first frame on the Y axis, respectively, and the first flexible connector system flexibly connects the first and second mass bodies with the first frame to enable a translation movement of the first and second mass bodies to be made in a Z-axis direction with respect to the first frame, and the first flexible connector system flexibly connects the first and second mass bodies with the first frame to enable a rotation movement of the first and second mass bodies based on the X axis with respect to the first frame.

The first flexible connector system may include a hinge and an arm, and the hinge may be formed in a plane substantially parallel with an XZ plane and the arm has a length of a Y direction.

The first flexible connector system may include a membrane and the membrane may be formed in a plane substantially parallel with an XY plane and is positioned to be adjacent to the XY plane.

The second flexible connector system may include a hinge and the hinge may be formed in a plane substantially parallel with a YZ plane and is positioned to be adjacent to the YZ plane.

The first flexible connector system may include a membrane, and the membrane may be formed in a plane substantially parallel with an XY plane and positioned to be adjacent to the XY plane.

The sensor may be configured to detect an angular velocity rotation based on the Y axis from a translation displacement of the first and second mass bodies in the Z-axis direction and detect angular velocities of rotations based on the X axis and the Z axis from rotation displacement of the first and second mass bodies based on the X axis.

The first flexible connector system may include plural sensors, the sensors being positioned at opposing positions in the first frame with respect to the X axis.

The first flexible connector system may further include a coupling hinge connecting the first mass body and the second mass body, and the coupling hinge may limit a relative translation displacement of the first mass body and the second mass body with respect to the Z-axis direction.

The coupling hinge may be formed in a plane parallel with an XZ plane.

The coupling hinge may connect the first mass body and the second mass body so that the first mass body and the second mass body are relatively displaced based on the X axis.

The first flexible connector system may limit translation movement of the first and second mass bodies in the X-axis direction and the Y-axis direction with respect to the second frame and limit rotation movement of the first and second mass bodies based on the Y axis and the Z axis.

The second flexible connector system may limit translation movement of the first frame in the X, Y, and Z axe-directions with respect to the second frame and limit rotation movement of the first frame based on the X axis and the Y axis.

Additional and/or other aspects will be set forth in part in the description which follows and, in part, will be apparent from the description, or may be learned by practice of the presented embodiments.

BRIEF DESCRIPTION OF DRAWINGS

These and/or other aspects will become apparent and more readily appreciated from the following description of one or more embodiments, taken in conjunction with the accompanying drawings, in which.

DETAILED DESCRIPTION

Figure 1:
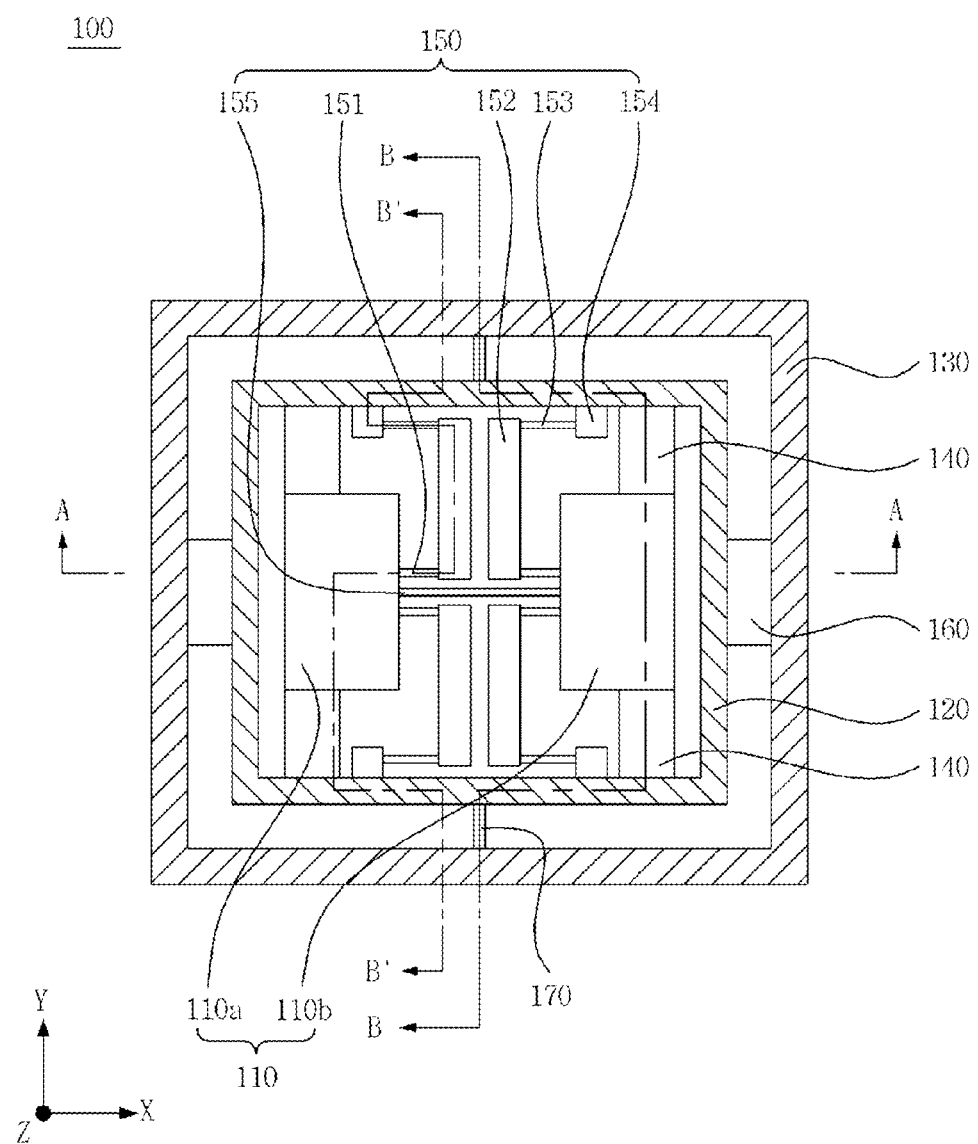
FIG. 1 is a plan view schematically illustrating an angular velocity sensor, according to one or more embodiments.

The following detailed description is provided to assist the reader in gaining a comprehensive understanding of the methods, apparatuses, and/or systems described herein. However, after an understanding of the present disclosure, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that may be well known to one of ordinary skill in the art may be omitted for increased clarity and conciseness.

The features described herein may be embodied in different forms, and are not to be construed as being limited to the examples described herein.

Various alterations and modifications may be made to the exemplary embodiments, some of which will be illustrated in detail in the drawings and detailed description. However, it should be understood that these embodiments are not construed as limited to the illustrated forms and include all changes, equivalents, or alternatives within the idea and the technical scope of this disclosure.

Terms used herein are to merely explain specific embodiments, thus it is not meant to be limiting. A singular expression includes a plural expression except when two expressions are contextually different from each other. For example, as used herein, the singular forms "a," "an" and "the" are intended to include the plural forms as well, unless the context clearly indicates otherwise. Herein, a term "include" or "have" are also intended to indicate that characteristics, figures, operations, components, or elements disclosed on the specification or combinations thereof exist. The term "include" or "have" should be understood so as not to pre-exclude existence of one or more other characteristics, figures, operations, components, elements or combinations thereof or additional possibility. In addition, use of the terms "first," "second," "one side," "the other side" and the like may be used herein to differentiate a certain component from another component, but the configuration of such components should not be construed to be limited by the terms. Further, below references to X, Y, and Z-axes with regard to the drawing illustrations are merely for explanation purposes and are not meant to limit the described embodiments thereto.

Unless otherwise defined, all terms including technical and scientific terms used herein have the same meaning as commonly understood by one of ordinary skill in the art to which this invention belongs, in view of the present disclosure. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Hereinafter, certain embodiments will be explained in more detail with reference to the attached drawings, wherein like reference numerals refer to like elements throughout. Like component or components corresponding to each other will be provided with the same reference numeral, and their detailed explanation will be omitted. When it is determined that a detailed description of a related or known function or configuration may make a purpose of an embodiment of the present disclosure unnecessarily ambiguous, such a detailed description may be omitted.

FIG. 1 is a plan view schematically illustrating an angular velocity sensor, according to one or more embodiments. As illustrated, an angular velocity sensor 100 may include a mass body part 110, a first frame 120, a second frame 130, a first flexible part 140, a second flexible part 150, a third flexible part 160, and a fourth flexible part 170, for example.

In an embodiment, the first and second flexible parts 140 and 150 may be respective sensing flexible parts, and may be individually or selectively provided with respective sensors, and the third and fourth flexible parts 160 and 170 may be respective vibrating flexible parts and may be individually or selectively provided with, or as, respective drivers.

The first and second flexible parts 140 and 150 may be piezoelectric or capacitive element sensors, while the third and fourth flexible parts 160 and 170 may be piezoelectric or capacitive element drivers, as only examples. The piezoelectric elements, for example, may be formed as or on such flexible parts, such as a plated or deposited layer thereon, that may generate electrical signals depending on their respective elastic deformations and/or measurable respective resistance changes depending on such elastic deformations. In one or more embodiments, such electrical signals and/or resistances may be measured from electrodes formed in the example piezoelectric element. For example, Coriolis forces may be measured by the piezoelectric or capacitive sensors of one or more of the first and/or second flexible parts 140 and 150. As noted, one or more of the third and/or fourth flexible parts may include piezoelectric driver elements that can be controlled to deform or vibrate by applying a charge, voltage, or signal to electrodes of the piezoelectric driver element.

Accordingly, in differing embodiments, the angular velocity sensor may include one or more controllers to control the driving of such piezoelectric or capacitive elements and/or to control the sensing of any deformation of such piezoelectric or capacitive elements, again noting that embodiments are not limited to such piezoelectric or capacitive elements, as other driver and/or sensing elements are also available. In addition, in one or more embodiments, one or more of the drivers of the third and/or fourth flexible parts 160 and 170 may be driven at a resonant frequency that substantially coincides with a resonant frequency of the sensing of sensor elements of one or more of the first and second flexible parts 140 and 150.

The mass body part 110 that may become displaced by a Coriolis force may include a first mass body 110a and a second mass body 110b, for example.

In addition, in one or more embodiments, the first and second mass bodies 110a and 110b may have the same size and be disposed to be symmetrical to each other.

Further, the first and second mass bodies 110a and 110b may be connected to the first frame 120 by the first and second flexible parts 140 and 150.

In an embodiment, the first and second mass bodies 110a and 110b may be displaced by a bending of the first flexible part 140 and a twisting deformation and rotation displacement of the second flexible part 150 when being applied with a Coriolis force. In this case, the first and second mass bodies 110a and 110b go through rotation and translation movement, which will be described below in greater detail.

Further, the first and second mass bodies 110a and 110b disposed in the first frame 120 may be disposed to be symmetrical to each other based on the fourth flexible part 170 connected to the first frame 120.

Further, the first frame 120 supports the mass body part 110. More specifically, the first frame 120 may have the first and second mass bodies 110a and 110b disposed therein and be connected to the mass body part 110 by the first and second flexible parts 140 and 150. That is, the first frame 120 serves to secure a space within which the mass body part 110 may become displaced and, thus, becomes a reference when the mass body part 110 is displaced, i.e., the mass body part 100 may move relative to the first frame 120. In addition, the first frame 120 may also be formed to cover or encircle only a portion of the mass body part 110.

Next, the second frame 130 supports the first frame 120. More specifically, the second frame 130 may be provided outside, external to, or away from the first frame 120 so as to be spaced apart from the first frame 120 and may be connected to the first frame 120 by the third and fourth flexible parts 160 and 170. Therefore, the first frame 120 and the mass body part 110 connected to the first frame 120 may be considered as being supported by the second frame 130 in a floated state so as to be displaceable, i.e., the first frame 120 and the mass body parts 110 may respectively move relative the second frame 130. In addition, in an embodiment, the second frame 130 may also be formed to cover or surround only a portion of the first frame 120.

Additional and/or alternative structural features, shapes, and/or organic connections of such components of the angular velocity sensor 100, according to one or more embodiments, will be described in greater detail below with reference to FIGS. 2 to 4.

Figure 2:
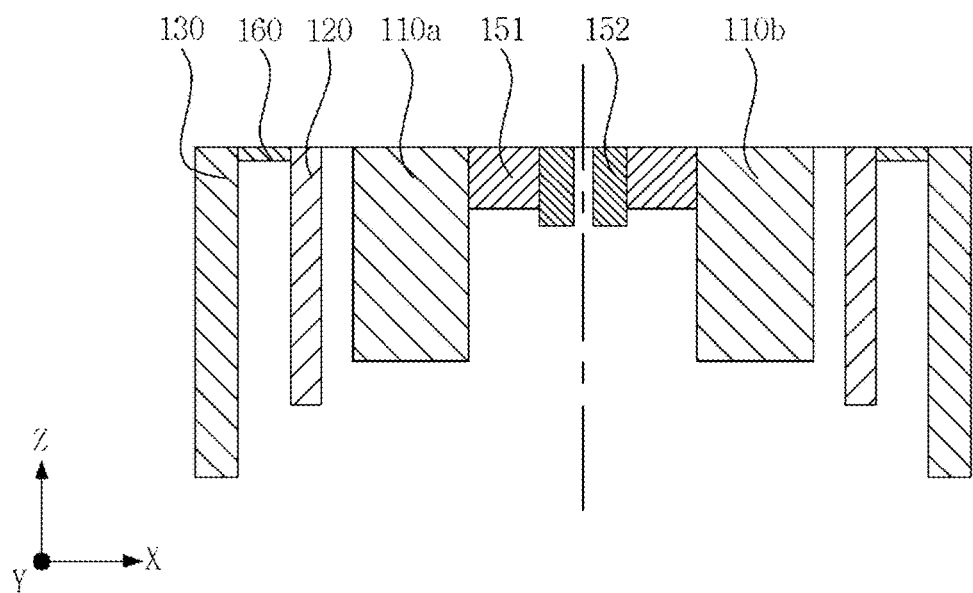
FIG. 2 is a schematic cross-sectional view of an angular velocity sensor, such as of the angular velocity sensor of FIG. 1 taken along the illustrated line A-A of FIG. 1, according to one or more embodiments.
Figure 3:
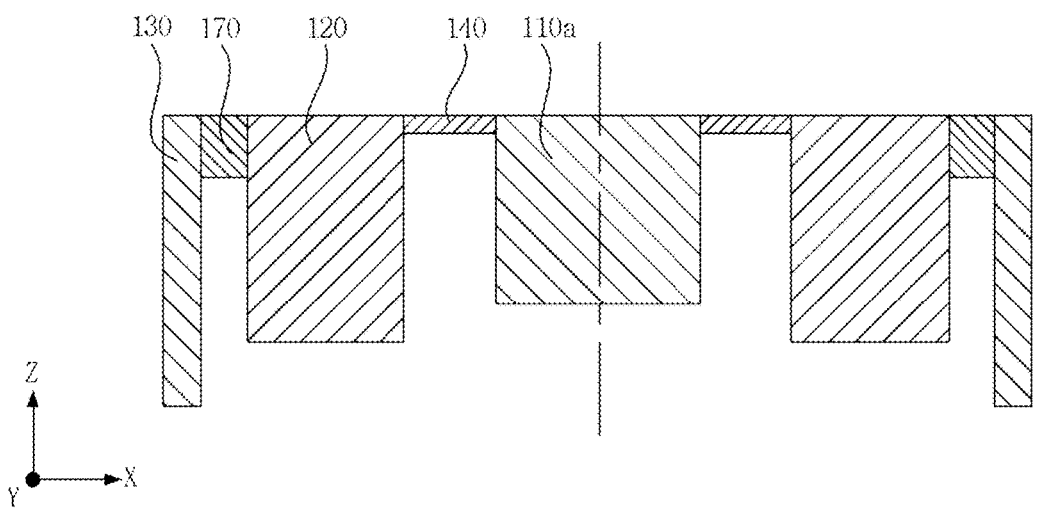
FIG. 3 is a schematic cross-sectional view of an angular velocity sensor, such as of the angular velocity sensor of FIG. 1 taken along the illustrated line B-B of FIG. 1, according to one or more embodiments.
Figure 4:
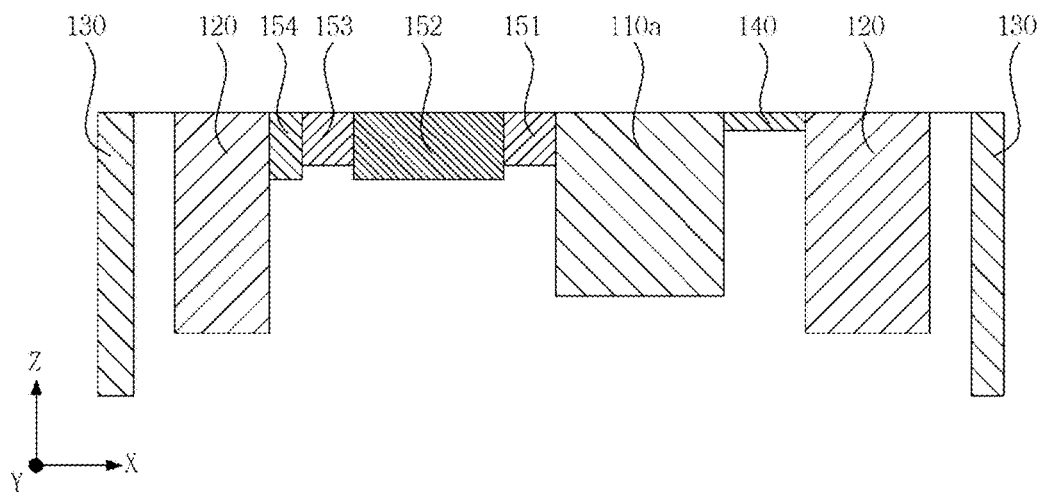
FIG. 4 is a schematic cross-sectional view of an angular velocity sensor, such as of the angular velocity sensor of FIG. 1 taken along the illustrated line B'-B' of FIG. 1, according to one or more embodiments.

FIG. 2 is a schematic cross-sectional view of an angular velocity sensor, such as of the angular velocity sensor of FIG. 1 taken along the illustrated line A-A of FIG. 1, FIG. 3 is a schematic cross-sectional view of an angular velocity sensor, such as the angular velocity sensor of FIG. 1 taken along the illustrated line B-B of FIG. 1, and FIG. 4 is a schematic cross-sectional view of an angular velocity sensor, such as of the angular velocity sensor of FIG. 1 taken along the illustrated line B'-B' of FIG. 1, according to one or more embodiments.

First, both ends of the first mass body 110a and the second mass body 110b may each be connected to the first frame 120 by the first flexible part 140 in the illustrated Y-axis direction.

In addition, each of the first flexible parts 140 may be a beam which has a predetermined thickness in the illustrated Z-axis direction and have surfaces formed by the illustrated X and Y axes. That is, each of the first flexible parts 140 may be formed so that a width in the X-axis direction is larger than a thickness in the Z-axis direction.

Further, in the Y-axis direction, one end of the first flexible part 140 may be connected to the mass body part 110 and the other end thereof connected to the first frame 120. To this end, each of the first flexible parts 140 may extend in the Y-axis direction.

Further, each of the first flexible parts 140 may be connected to both illustrated upper and lower sides of the first mass body 110a and the second mass body 110b in the Y-axis direction.

In addition, one or more of the first flexible parts 140 may be provided with the sensor. That is, when viewed based on an XY plane, for example, each of the first flexible parts 140 may be relatively wider than the second flexible part 150. Therefore, one or more of the first flexible parts 140 may be provided with a sensor sensing the displacements of the first and second mass bodies 110a and 110b.

Further, the sensor is not particularly limited, but may be formed to use a piezoelectric type, a piezoresistive type, a capacitive type, an optical type, and the like.

Further, the first mass body 110a and the second mass body 110b may be connected to the second flexible part 150 in the X-axis direction and the second flexible part 150 connected to the first frame 120.

Further, the second flexible part 150 may serve to connect the first mass body 110a and the second mass body 110b, respectively, to the first frame 120 so that the first mass body 110a and the second mass body 110b can perform rotation and translation movements. To this end, the second flexible part may include a first hinge 151, an arm 152, a second hinge 153, a fixed arm 154, and a coupling hinge 155, for example.

In more detail, the first hinges 151 may be connected to both upper and lower side portions of the first mass body 110a and the second mass body 110b so that rotation displacements of the first mass body 110a and the second mass body 110b may be made and the arm 152, the second hinge 153, and the fixed arm 154 may be connected to the first mass body 110a and the second mass body 110b, respectively, so that the translation displacements of the first mass body 110a and the second mass body 110b may be made.

Further, the arm 152 may be connected to the other end of the first hinge 151 having one end connected to the first mass body 110a and the second mass body 110b, respectively, and the connection made so that an extending direction of the arm 152 is different from a direction in which the first hinge 151 is connected to the first mass body 110a and the second mass body 110b.

Further, one side of the second hinge 153 may be connected to the other side of the arm 152 to which the first hinge 151 is connected so that the rotation displacement of the arm 152 may be made.

Further, one side of the fixed arm 154 may be connected to the other side of the second hinge 153, which may be connected to the arm 152, and another side of the fixed arm 154 may be connected to the first frame 120.

Further, the first hinge 151 and the second hinge 153 may be disposed to be parallel with each other and the arm 152 may be disposed to be orthogonal to the first hinge 151 and the second hinge 153.

Further, the first hinges 151 may be connected to both sides of the first mass body 110a and the second mass body 110b so that the rotation displacements of the first mass body 110a and the second mass body 110b, respectively, may be made.

Further, each of the first hinges 151 and the second hinges 153 may have respectively predetermined thicknesses in the Y-axis direction and may have surfaces formed by the X and Z axes. For example, each of the first hinges 151 and the second hinges 153 may be formed so that a width in the Z-axis direction is larger than a thickness in the Y-axis direction.

Further, each of the first hinges 151 and the second hinges 153 may be positioned to extend in the X-axis direction and each of the arms 152 may be positioned to extend in the Y-axis direction.

Further, one end of the first hinge 151 extending in the X-axis direction may be connected to the first mass body 110a and the second mass body 110b and another end thereof connected to the arm 152, and one end of the second hinge 153 extending in the X-axis direction may be connected to the fixed arm 154, which may be coupled with the first frame 120, while another end of the second hinge 153 may be connected to the arm 152.

Further, the connection direction of the first flexible part 140 may be disposed to be orthogonal to the connection direction between the first hinge 151 and the second hinge 153 of the second flexible part 150. That is, the first flexible part 140 may connect the first mass body 110a and the second mass body 110b, respectively, to the first frame 120 in the Y-axis direction, the first hinge 151 of the second flexible part 150 may be connected to the first mass body 110a and the second mass body 110b, respectively, in the X-axis direction, and the second hinge 153 may also be connected to the arm 152 and the fixed arm 154 in the X-axis direction.

Accordingly, in one or more embodiments, rotation displacements of the first mass body 110a and the second mass body 110b may be made based on the X axis, but may not be relatively freely made based on the Y axis.

Further, the first hinges 151 and the second hinges 153 of the second flexible parts 150 may be connected to both sides of the arm 152, which extends in the Y axis, while another end of the second hinge 153, having one end connected to the arm 152, may be connected to the fixed arm 154. Thus, as the fixed arm 154 is connected to the first frame 120 in the Y-axis direction, the translation displacement of the mass body 110 may be made in the Z-axis direction in addition to the rotation displacement of the mass body 110 in the X-axis direction by the link structure of the second flexible parts 150.

Further, as illustrated in FIG. 1, the first flexible parts 140 may be connected to opposing illustrated top and bottom sides of the first mass body 110a and the second mass body 110b in the Y-axis direction and the second flexible parts 150 may be connected to both upper and lower side portions of the mass body 110 in the Y-axis direction.

Here, the coupling hinge 155 may serve to move in the same direction when the first mass body 110a and the second mass body 110b perform the translation movement. That is, when the first mass body 110a and the second mass body 110b perform the translation movement in the Z-axis direction, the coupling hinge may couple the first mass body 110a and the second mass body 110b so that both of the first mass body 110a and the second mass body 110b are positively or negatively displaced and any one thereof is positively displaced and the other thereof is not negatively displaced, for example, with respect to the first frame.

To this end, the coupling hinge 155 may be formed to have the surface formed in the X-axis and Z-axis directions and the thickness in the Y-axis direction.

Further, the coupling hinge 155 may be disposed in parallel with the first hinge 151 and connect the first mass body 110a and the second mass body 110b in the X-axis direction. Further, in one or more embodiments, the coupling hinge 155 may be connected to the central side portions of the first mass body 110a and the second mass body 110b, respectively, with respect to the Y-axis direction.

Next, each of the third flexible parts 160 may be configured as a beam, for example, which may have a predetermined thickness in the Z-axis direction and have surfaces formed by the X axis and the Y axis. That is, each of the third flexible parts 160 may be formed so that the width in the Y-axis direction is larger than the thickness in the Z-axis direction. Further, each of the third flexible parts 160 may have one end connected to the first frame 120 and another end connected to the second frame 130 with respect to the X-axis direction.

As described above, the direction in which the first flexible part 140 connects the mass body part 110 and the first frame 120 and the direction in which the third flexible part 160 connects the first frame 120 and the second frame 130 may be orthogonal to each other.

Further, each of the fourth flexible parts 170 may be configured of a hinge, which may have a predetermined thickness in the X-axis direction and have surfaces formed by the Y and Z axes. That is, each of the fourth flexible parts 170 may be formed so that the width in the Z-axis direction is larger than the thickness in the X-axis direction. Therefore, the rotation of the first frame 120 based on the X axis or the translation of the first frame 120 in the Z-axis direction may both be limited, while the first frame 120 may be configured to relatively freely rotate based on the Y axis. That is, the first frame 120 may be affixed to the second frame 130 in a manner to enable the first frame 120 to rotate, relative to the second frame 130, based on the Y-axis direction, e.g., with the fourth flexible part 170 serving as a hinge for this purpose.

Further, in one or more embodiments, the fourth flexible part 170 may be coupled with a central side portion of the first frame 120 and the first frame 120 may rotate to be symmetrically displaced based on the fourth flexible part 170.

Further, the third and fourth flexible parts 160 and 170 may be disposed so that the extending directions of the third flexible part 160 and the fourth flexible part 170, that is, directions in which they respectively connect between the first frame 120 and the second frame 130, are orthogonal to each other.

That is, the third flexible part 160 may be coupled with the first frame 120 and the second frame 130 in the X-axis direction and the fourth flexible part 170 may be coupled with the first frame 120 and the second frame 130 in the Y-axis direction.

Therefore, the first frame 120 may be supported by the second frame 130 through the third and fourth flexible parts 160 and 170 and a rotation displacement of the first frame 120 may be made with respect to the Y-axis direction by the fourth flexible part 170.

In addition, the third and fourth flexible parts 160 and 170 may be selectively provided with, or as, respective drivers. Here, the respective drivers may drive the first frame 120 and may be respective piezoelectric type drivers, capacitive type drivers, or the like, as only examples. In addition, when viewed based on the XY plane, each of the third flexible parts 160 may be relatively wider than each of the fourth flexible parts 170. Therefore, in an embodiment, only the third flexible part 160 may be provided with, or as, the respective driver for driving the first frame 120.

In addition, as the first to fourth flexible parts 140 to 170 may be disposed as described above, a connection direction in which the first hinge 151 and the second hinge 153 of the second flexible part 150 connects the mass body part 110 and the first frame 120 may be orthogonal to the connection direction in which the fourth flexible part 170 connects the first frame 120 and the second frame 130.

Further, the first hinge 151, the second hinge 153, and the coupling hinge 155, of the second flexible part 150, and the fourth flexible part 170 of such an angular velocity sensor, depending on embodiment, may have all possible shapes, such as a hinge shape having a rectangular cross section, a torsion bar shape having a circular cross section, or the like, that are not limited by the above example descriptions.

Further, as an example, potential movable directions of the first mass body and the second mass body of FIG. 1 are shown in the following Table 1.

TABLE 1

| Potential movable directions of first and second mass bodies (relative to first frame) | Movement possible? |
| --- | --- |
| Rotation based on X axis | Possible |
| Rotation based on Y axis | Limited |
| Rotation based on Z axis | Limited |
| Translation in X axis direction | Limited |
| Translation in Y axis direction | Limited |
| Translation in Z axis direction | Possible |

Figure 5A:
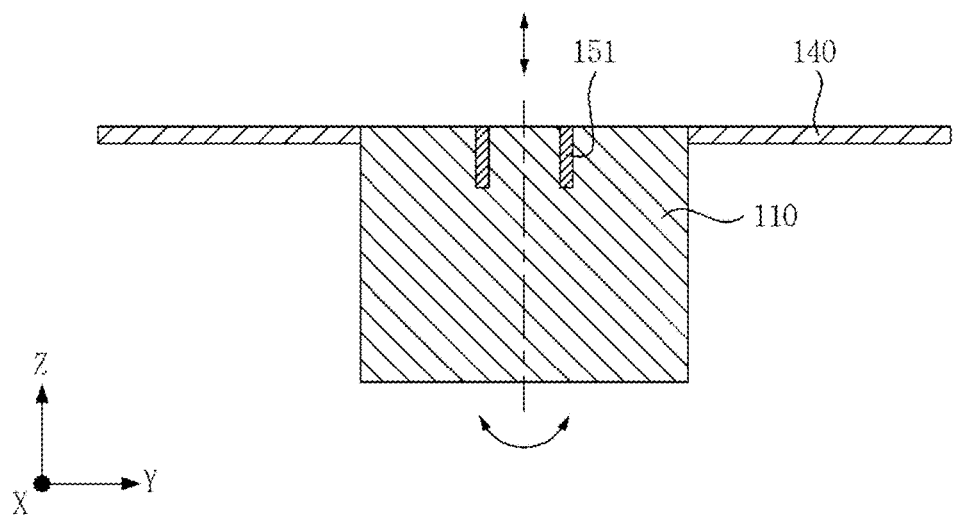
FIGS. 5A and 5B are schematic cross-sectional views of a movable direction and a movement stage of an angular velocity sensor, such as of the angular velocity sensor illustrated in FIG. 1, according to one or more embodiments.
Figure 5B:
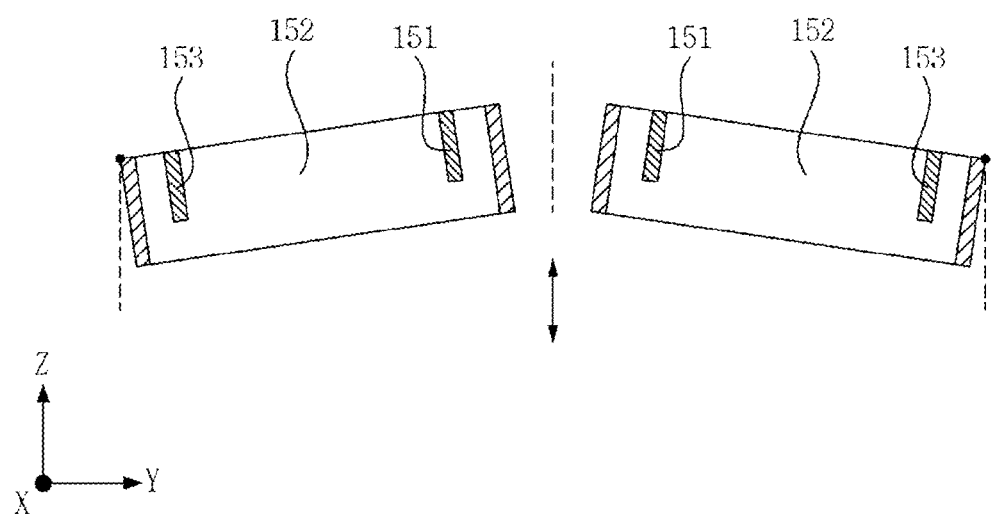

Consequently, as illustrated in FIGS. 5A and 5B, the rotation displacement of the mass body part 110 may be made based on the X-axis direction and the translation displacement thereof may be made in the Z-axis direction due to the link structure of the first hinge 151, the arm 152, and the second hinge 153, for example.

Next, in an embodiment, since the width in the Z-axis direction of each of the fourth flexible parts 170 is larger than a thickness in the X axis direction, the rotation of the first frame 120 based on the X axis or the translation of the first frame 120 in the Y-axis direction, with respect to the second frame, may be limited, while the first frame 120 may be relatively free to rotate based on the Y axis.

As a result, due to the characteristics of the third and fourth flexible parts 160 and 170 described above, the first frame 120 may rotate based on the Y axis with respect to the second frame 130, but the rotation of the first frame 120 based on the X axis or the Z axis or the translation of the first frame 120 in the Z-axis, Y-axis, or X-axis direction may be limited. For example, potential movable directions of the first frame 120, relative to the second frame 130, are shown in the following Table 2.

TABLE 2

| Potential movement direction of first frame (relative to the second frame) | Movement possible? |
|---|---|
| Rotation based on X axis | Limited |
| Rotation based on Y axis | Possible |
| Rotation based on Z axis | Limited |
| Translation in X axis direction | Limited |
| Translation in Y axis direction | Limited |
| Translation in Z axis direction | Limited |

As described above, since the first frame 120 may rotate with respect to the second frame 130 based on the Y axis, while movement of the first frame 120 in the remaining directions may be limited, the angular sensor may be configured so that the first frame 120 is allowed to be displaced (relative to the second frame 130) only with respect to a force in a desired direction, e.g., the rotation based on the Y axis.

Figure 6:
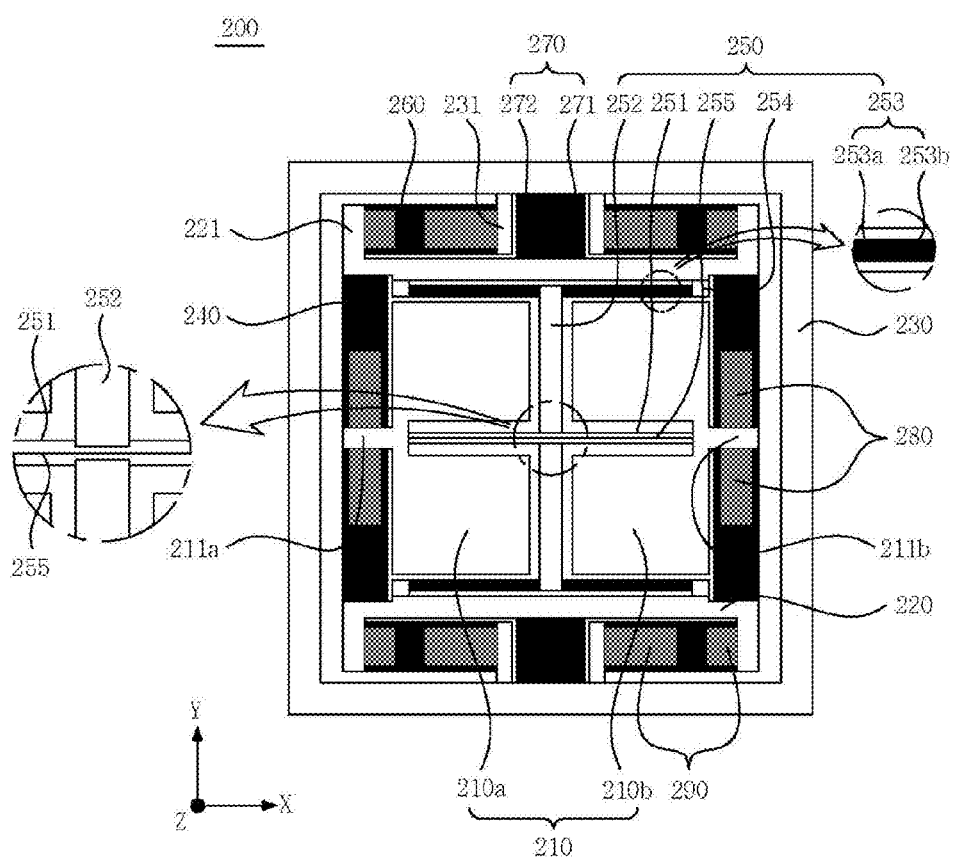
FIG. 6 is a plan view schematically illustrating an angular velocity sensor layout, according to one or more embodiments.

FIG. 6 is a plan view schematically illustrating an angular velocity sensor layout, according to one or more embodiments. As illustrated in FIG. 6, descriptions of components of the angular velocity sensor 200 corresponding to those of the angular velocity sensor 100 illustrated in FIG. 1 that have the same functions, and potentially same shapes, will not be repeated below. Therefore, the below discussion of FIG. 6 will discuss shapes and organic connections that may differ from those described above with regard to the angular sensor of FIG. 1. In addition, FIGS. 7A-7C further demonstrate referenced components of FIG. 6 from a different perspective.

In more detail, the angular velocity sensor 200 includes a mass body part 210, a first frame 220, a second frame 230, a first flexible part 240, a second flexible part 250, a third flexible part 260, a fourth flexible part 270, a sensing electrode 280, and a vibrating electrode 290.

Further, the mass body part 210 includes a first mass body 210a and a second mass body 210b. Further, the first and second mass bodies 210a and 210b are connected to the first frame 220 by the first and second flexible parts 240 and 250.

In addition, the first and second mass bodies 210a and 210b are displaced by a bending of the first flexible part 240 and a twisting deformation and a rotation displacement of the second flexible part 250 when being applied with a Coriolis force. In this case, the rotation and translation movements of the first and second mass bodies 210a and 210b are made.

Next, the second frame 230 supports the first frame 220. In more detail, the second frame 230 is connected to the first frame 220 by the third and fourth flexible parts 260 and 270. Therefore, the first frame 220 and the mass body part 210 connected to the first frame 220 are supported by the second frame 230 in a floated state so as to be displaceable.

In more detail, the first flexible part 240 may be configured as a beam which has a predetermined thickness in a Z-axis direction and has a surface formed by an X axis and a Y axis.

Further, the first flexible part 240 has one end connected to the mass body part 210 and another end connected to the first frame 220 with respect to the Y-axis direction.

To this end, the first mass body 210a and the second mass body 210b are each provided with protrusion coupling parts 211a and 211b which protrude in the X-axis direction and the first flexible parts 240 are connected to both sides of the protrusion coupling parts 211a and 211b.

Further, the first flexible part 240 may be provided with a sensor which senses the displacements of the first and second mass bodies 210a and 210b. As only an example, FIG. 6 illustrates that the sensing electrode 280 is formed on, or as part of, the first flexible part 240.

Thus, the sensing electrodes 280 are each formed at the first flexible parts 240 which are connected to both sides of the protrusion coupling parts 211a and 211b. This is to output a signal value using a bending stress of the first flexible part 240 depending on the rotation displacement of the mass body part 210.

Next, the first mass body 210a and the second mass body 210b are connected to the second flexible parts 250 in the X-axis direction and the second flexible parts 250 are each connected to the first frame 220.

Further, the second flexible part 250 serves to connect the mass body part 210 to the first frame 220 so that the rotation and translation movements of the mass body part 210 may be made. To this end, the second flexible part 250 includes a first hinge 251, an arm 252, a second hinge 253, a fixed arm 254, and a coupling hinge 255.

Further, the second hinge 253 includes a hinge part 253a and a beam part 253b.

By this configuration, the rotation movement of the first mass body 210a and the second mass body 210b, respectively, is made based on the X-axis direction and the first hinge 251 and the second hinge 253 of the second flexible part 250 serve as a hinge for this purpose.

Further, the translation movement of the first mass body 210a and the second mass body 210b may be made in the Z-axis direction as the first hinge 251 and the second hinge 253 are each connected to the arm 252 and the fixed arm 254. Further, the translation displacements of the first mass body 210a and the second mass body 210b are made in the same direction by the coupling hinge 255.

Next, the third flexible part 260 is configured as a beam which has a predetermined thickness in the Z-axis direction and has a surface formed by the X and Y axes. Further, the third flexible part 260 has one end connected to a protrusion coupling part 221 of the first frame 220 and another end connected to a protrusion coupling part 231 of the second frame 230 with respect to the X-axis direction.

Further, the fourth flexible part 270 is a hinge which has a predetermined thickness in the X-axis direction and has a surface formed by the Y and Z axes. Therefore, the rotation of the first frame 220 based on the X axis or the translation of the first frame 120 in the Z-axis direction is limited, while the first frame 120 may relatively freely rotate based on the Y axis. That is, the first frame 220 may be fixed to the second frame 130 to thereby rotate based on the Y-axis direction, and the fourth flexible part 270 serves as the hinge for this purpose.

Further, the fourth hinge part 270 includes a hinge part 271 and a beam part 272. Further, as only an example, the fourth flexible part 270 may be formed in a "T"-letter shape in which the hinge part 271 is coupled with one surface of the beam part 272.

Further, in an embodiment, the fourth flexible part 270 is coupled with a central portion of the first frame 220 and the first frame 220 may rotate to be symmetrically displaced based on the fourth flexible part 270.

Further, the third and fourth flexible parts 260 and 270 may be disposed so that the connection directions of the third flexible part 260 and the fourth flexible part 270, that is, directions in which they connect between the first frame 120 and the second frame 130 are orthogonal to each other. That is, the third flexible part 260 is coupled with the first frame 220 and the second frame 230 in the X-axis direction and the fourth flexible part 270 is coupled with the first frame 220 and the second frame 230 in the Y-axis direction.

In addition, one or more of the third and/or fourth flexible parts 260 and 270 may be selectively provided with, or as, respective drivers. For example, the drivers may be vibration generating drivers to generate vibration in any of the third and/or fourth flexible parts 260 and 270. Here, the respective drivers may be controlled to drive the first frame 220, and thereby drive the mass body part 210, and may be formed as respective piezoelectric type drivers, capacitive type drivers, or the like, as only examples. For example, in an embodiment, FIG. 6 illustrates that the driving electrode 290 is formed at the third flexible parts 260.

Figure 7A:
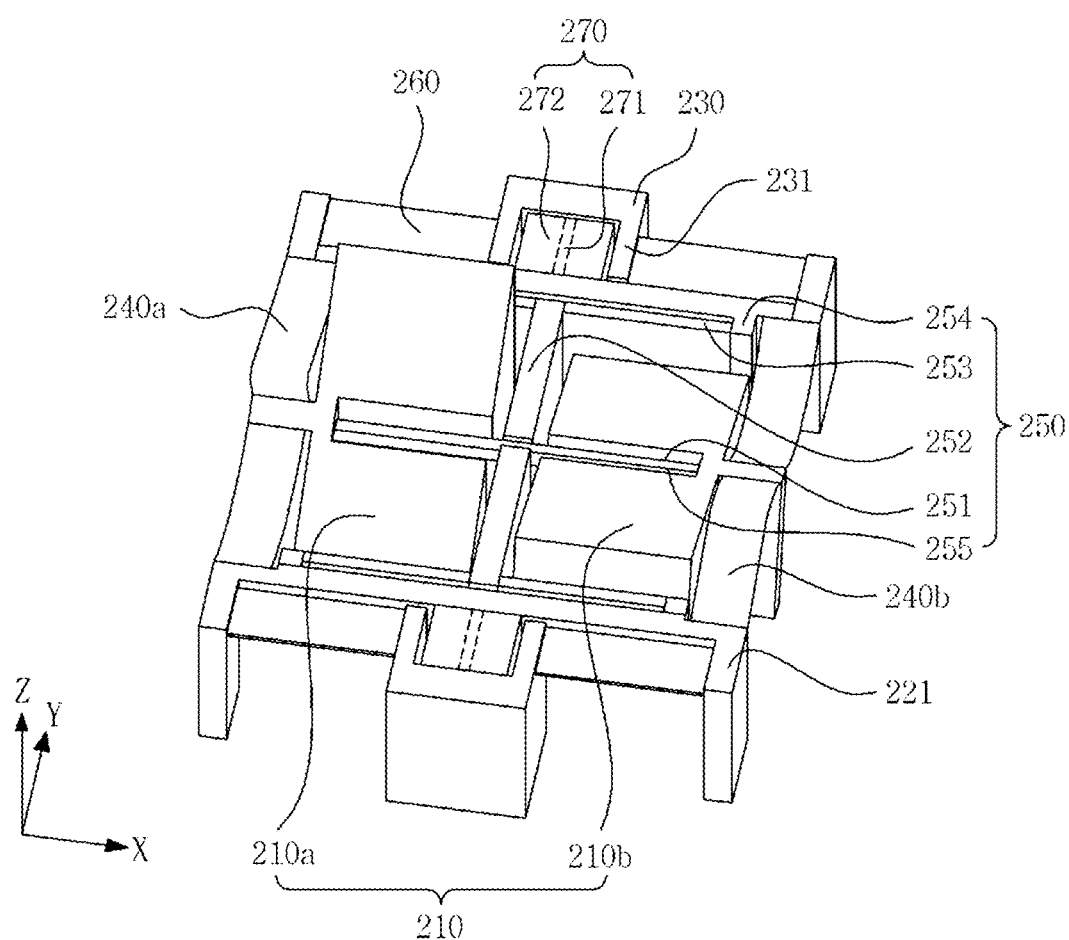
FIGS. 7A to 7C are schematic use state diagrams of the angular velocity sensor illustrated in FIG. 6, according to one or more embodiments.
Figure 7B:
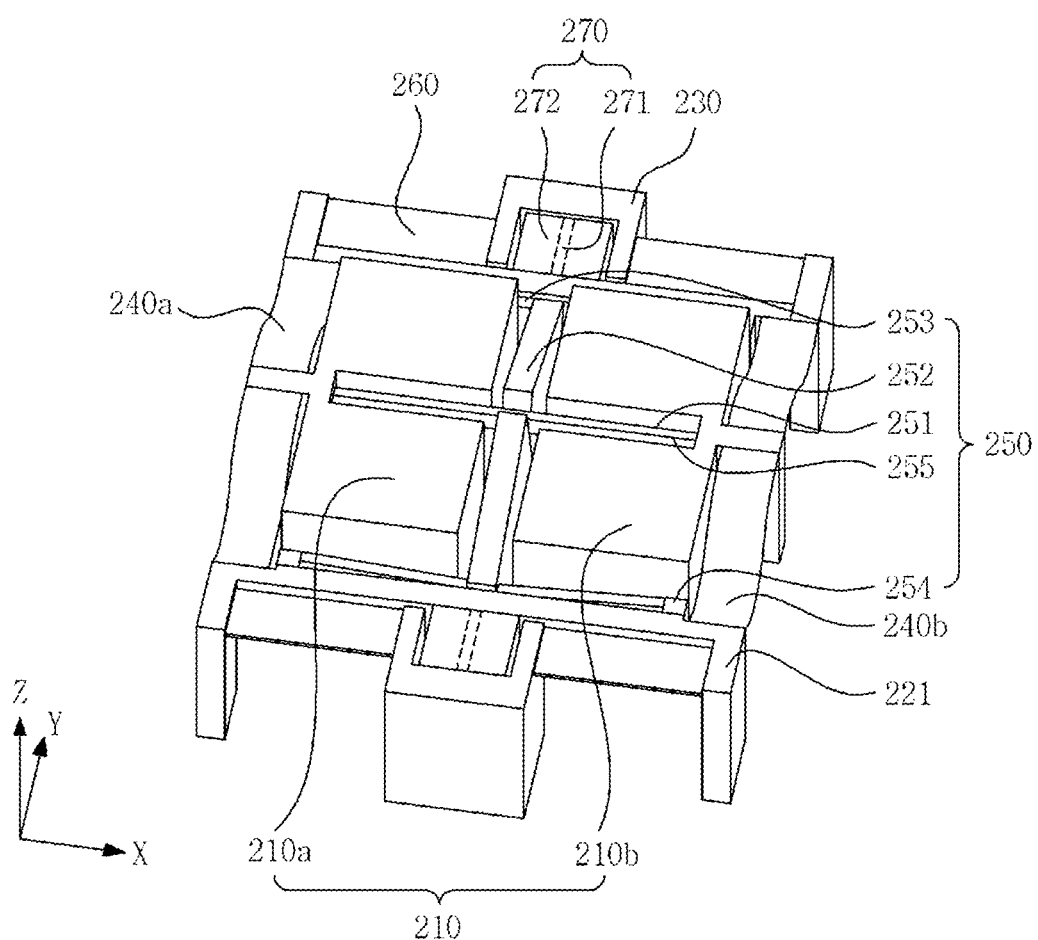
Figure 7C:
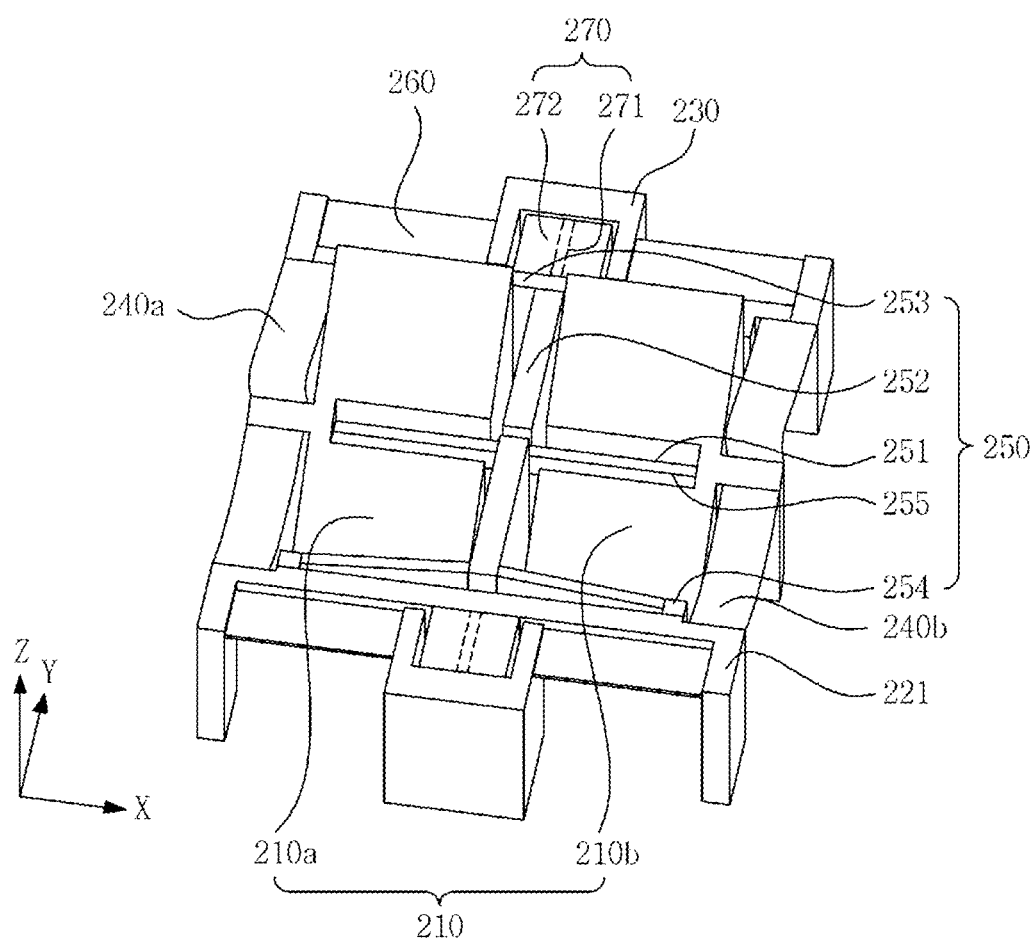

FIGS. 7A to 7C are schematic use state diagrams of the angular velocity sensor illustrated in FIG. 6, according to one or more embodiments. As illustrated in FIGS. 7A to 7C, the rotation displacement of the first mass body 210a and the second mass body 210b of the mass body part 210 of the angular velocity sensor 200 is made based on the X-axis direction or the translation displacement thereof is made based on the Z-axis direction.

In more detail, when the first frame 220 and the mass body part 210 rotate based on the Y axis, the driving velocity component of the first mass body 210a is generated in an example (+)Z-axis direction and an example (−)X-axis direction and is then generated in the (−)Z-axis direction and the (+)X-axis direction and the driving speed component of the second mass body 210b is generated in the (−)Z-axis direction and the (−)X-axis direction and is then generated in the (+)Z-axis direction and (+)X-axis direction.

The first mass body 210a and the second mass body 210b are applied with the Coriolis force in an outer product vector direction of the driving speed with the input angular velocity, in which a detailed combination of the angular velocity direction with the Coriolis force direction will be described below.

Further, FIG. 7A illustrates that the rotation displacements of the first mass body 210a and the second mass body 210b are made in an opposite direction to each other based on the X-axis direction, FIG. 7B illustrates that the translation displacements of the first mass body 210a and the second mass body 210b are made in the Z-axis direction, and FIG. 7C illustrates that the rotation displacements of the first mass body 210a and the second mass body 210b are made in the same direction as each other based on the X-axis direction.

Further, when the angular velocity rotating based on the X axis is applied to the first and second mass bodies 210a and 210b, the Coriolis force is generated in the first mass body 210a in the example (−)Y-axis direction and is then generated in the (+)Y-axis direction, and the Coriolis force is generated in the second mass body 210b in the (+)Y-axis direction and is then generated in the (−)Y-axis direction.

Therefore, the first and second mass bodies 210a and 210b rotate based on the X axis in opposite directions to each other as illustrated in FIG. 7A, the sensor which is formed in the first flexible parts 240a and 240b, respectively, may sense the displacements of the first and second mass bodies 210a and 210b so the angular sensor can calculate the Coriolis force, and the angular velocity rotating based on the X axis may be measured through the calculated Coriolis force. In this case, when signals each generated by sensors of first flexible parts 240a each connected to both sides of the first mass body 210a are defined as SY1 and SY2 and signals each generated by sensors of first flexible parts 240b each connected to both sides of the second mass body 210b are defined as SY3 and SY4, angular velocity rotating based on the X axis may be calculated from (SY1−SY2)−(SY3−SY4), for example. As illustrated in FIG. 7A, because the signals are differentially output between the first and second mass bodies 210a and 210b rotating in an opposite direction to each other, acceleration noise may also be offset.

Further, when the angular velocity rotating based on the Z axis is applied to the first and second mass bodies 210a and 210b, respectively, the Coriolis force is generated in the first mass body 210a in the (−)Y-axis direction and is then generated in the (+)Y-axis direction, and the Coriolis force is generated in the second mass body 210b in the (−)Y-axis direction and is then generated in the (+)Y-axis direction. Therefore, the first mass body 210a and the second mass body 201b rotate in the same direction based on the X axis as illustrated in FIG. 7C. In this case, when the signals each generated by sensors of first flexible parts 240a each connected to both sides of the first mass body 210a are defined as SY1 and SY2 and the signals each generated by sensors of first flexible parts 240b each connected to both sides of the second mass body 210b are defined as SY3 and SY4, angular velocity rotating based on the Z axis may be calculated from (SY1−SY2)+(SY3−SY4), for example.

Further, when the angular velocity rotating based on the Y axis is applied to the first and second mass bodies 210a and 210b, respectively, the first mass body 210a and the second mass body 210b are translated in the Z-axis direction as illustrated in FIG. 7B. In this case, when the signals each generated by sensors of first flexible parts 240a each connected to both sides of the first mass body 210a are defined as SY1 and SY2 and the signals each generated by sensors of first flexible parts 240b each connected to both sides of the second mass body 210b are defined as SY3 and SY4, angular velocity rotating based on the Y axis may be calculated from (SY1+SY2)−(SY3+SY4), for example.

Therefore, the angular velocity sensor 200 may detect the angular velocity rotating based on the X axis, the Y axis, and the Z axis to obtain the third angular velocity. In this case, as a calculation of a digital output terminal may not be required, a burden of noise and calibration involved in such calculations may be removed, and miniaturization may be implemented. Further, because of these example arrangements, mechanical and electrical noises may be minimized or removed, low power may be implemented, and simplification of an angular velocity sensor package may be achieved.

Figure 8:
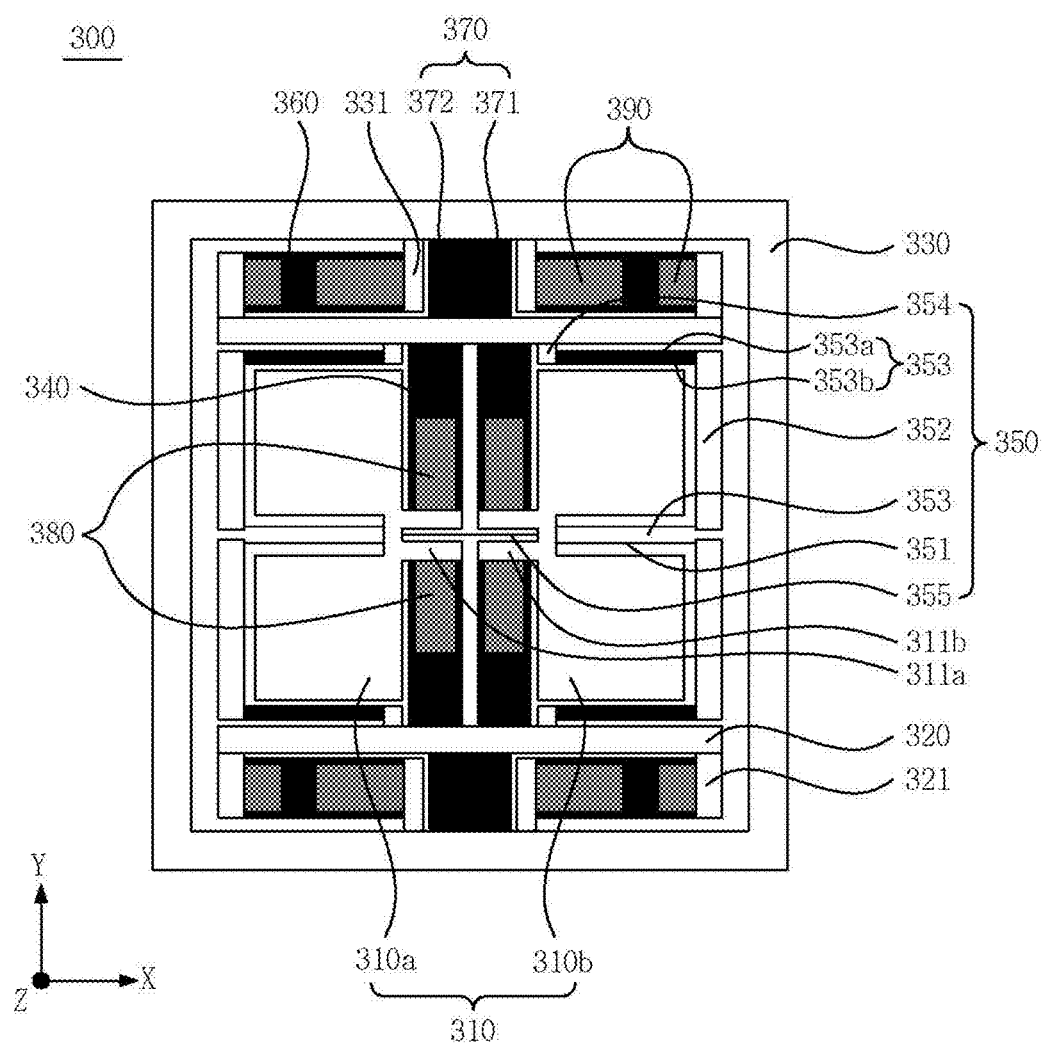
FIG. 8 is a plan view schematically illustrating an angular velocity sensor layout, according to one or more embodiments.

FIG. 8 is a plan view schematically illustrating an angular velocity sensor layout, according to one or more embodiments. Further, comparing the angular velocity sensor 300 with the angular velocity sensor 200 of FIG. 6, below a different position and organic connection of the first flexible part and the second flexible part will be discussed.

In more detail, the angular velocity sensor 300 includes a mass body part 310, a first frame 320, a second frame 330, a first flexible part 340, a second flexible part 350, a third flexible part 360, a fourth flexible part 370, a sensing electrode 380, and a driving electrode 390.

Further, the first flexible part 340 is positioned between a first mass body 310a and a second mass body 310b. Further, a first hinge 351, an arm 352, a second hinge 353, and a fixed arm 354 of the second flexible part 250 are positioned outside the first mass body 310a and the second mass body 310b, respectively between the first and second mass bodies 310a and 310b and the first frame 320, and a coupling hinge 355 connects between the first mass body 310a and the second mass body 310b. The second hinge 353 may include a hinge part 353a and a beam part 353b.

Further, the first flexible part 340 is provided with the sensing electrode 380 and the third flexible part 360 is provided with the driving electrode 390.

Further, the first mass body 310a and the second mass body 310b are each provided with protrusion coupling parts 311a and 311b which protrude in the X-axis direction and the first flexible parts 340 are connected to both sides of the protrusion coupling parts 311a and 311b.

Further, the fourth flexible part 370 includes a hinge part 371 and a beam part 372. Further, as only an example, the fourth flexible part 370 may be formed in a "T"-letter shape in which the hinge part 371 is coupled with one surface of the beam part 372, similar to the configuration of the hinge part 271 and beam part 272 of FIGS. 6-7C.

Further, organic connections and shapes of the first frame 320, the second frame 330, the first flexible part 340, the second flexible part 350, the third flexible part 360, and the fourth flexible part 370 may the same as or similar to the foregoing descriptions and therefore the description thereof will be omitted.

Accordingly, as only non-liming examples, one or more embodiments may provide an angular velocity sensor capable of detecting 3-axis angular velocity, implementing miniaturization, removing mechanical and electrical noise, implementing low power, and/or simplifying a package by connecting a plurality of mass bodies to a first frame to allow rotation and translation displacements of the mass bodies to be performed and connecting the first frame to a second frame to allow a rotation displacement of the first frame to be performed.

As a non-exhaustive example only, and in addition to any above explanation of potential hardware embodiments of the angular velocity sensor in an electronic device, such as artificial satellites, projectiles, unmanned aircraft, vehicles, air bag systems, electronic stability control (ESC) systems, black box systems for vehicles, hand shaking prevention of video or image camera, motion sensing system of a mobile phone or game machine, or navigation system, etc., an electronic device embodiment herein that includes such an angular velocity sensor, as described herein, may also be such a mobile device, such as a cellular phone, a smart phone, a wearable smart or bio-signal device, a digital stylus, a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a television or display, a DVD player, a Blu-ray player, a set-top box, or a home appliance, an Internet of Things device, or any other mobile or stationary device, including any such device capable of wireless or network communication.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is not limited by the detailed description, but further supported by the claims and their equivalents, and all variations within the scope of the claims and their equivalents are to be construed as being included in the disclosure.

What is claimed is:

1. An angular velocity sensor, comprising:
    a first mass body and a second mass body;
    a first frame;
    a first flexible connector system connecting the first mass body and the second mass body to the first frame and including a sensor configured to detect displacement of one or more of the first mass body and the second mass body;
    a second frame provided separate from the first frame; and
    a second flexible connector system connecting the first frame and the second frame and including a driver configured to drive movement of the first frame with respect to the second frame,
    wherein the first mass body and the second mass body are flexibly connected to the first frame by the first flexible connector system to enable the first mass body and the second mass body to rotate in a first axis direction and translate in a second axis direction different from the first axis direction, and
    the first frame is flexibly connected to the second frame by the second flexible connector system to enable rotation displacement of the first frame, relative to the second frame, in a third axis direction different from the first and second axis directions.

2. The angular velocity sensor of claim 1, wherein the first flexible connector system limits rotation displacements of the first mass body and the second mass body in the second and third axis directions and limits translation displacements of the first mass body and the second mass body in the first and third axis directions, with respect to the first frame.

3. The angular velocity sensor of claim 1, wherein the second flexible connector system limits rotation displacements of the first frame in the first and second axis directions and limits translation displacements of the first frame in the first and third axis directions, with respect to the second frame.

4. The angular velocity sensor of claim 1, wherein the first flexible connector system includes:
    first flexible connectors flexibly connecting the first mass body and the second mass body, respectively, to the first frame and configured as beams so as to enable respective bending displacements of the first mass body and the second mass body, with respect to the first frame; and
    second flexible connectors flexibly connecting the first mass body and the second mass body, respectively, to the first frame and having link structures so as to enable respective twisting displacements and rotation displacements of the first mass body and the second mass body, with respect to the first frame.

5. The angular velocity sensor of claim 4, wherein the second flexible connectors having link structures include:
first hinges connected to the first mass body and the second mass body, respectively, so that rotation displacements of the first mass body and the second mass body are made;
arms connected to respective first hinge portions of the first hinges and extending in directions different from a direction in which the first hinges are connected to the first mass body and the second mass body, second hinge portions of the first hinges being connected to the first mass body and the second mass body, respectively;
second hinges connected to respective first side portions of the arms so that respective rotation displacements of the arms are made, second side portions of the arms being connected to the first hinge portions of the first hinges, respectively; and
fixed arms connecting respective first hinge portions of the second hinges and the first frame, second hinge portions of the second hinges being connected to the first side portions of the arms, respectively.

6. The angular velocity sensor of claim 4, wherein the second flexible connectors having link structures include:
first hinges connected to the first mass body and the second mass body, respectively, so that rotation displacements of the first mass body and the second mass body are made;
arms connected to respective first hinge portions of the first hinges and extending in directions different from a direction in which the first hinges are connected to the first mass body and the second mass body, second hinge portions of the first hinges being connected to the first mass body and the second mass body, respectively; and
second hinges connected to respective first side portions of the arms so that respective rotation displacements of the arms are made and so to respectively link the second hinges to the first frame, second side portions of the arms being connected to the first hinge portions of the first hinges, respectively.

7. The angular velocity sensor of claim 6, wherein the second flexible connectors further include a coupling hinge connecting the first mass body and the second mass body.

8. The angular velocity sensor of claim 6, wherein the second hinge portions of the first hinges respectively connect to center portions of the first mass body and the second mass body.

9. The angular velocity sensor of claim 6, wherein the first hinges and the second hinges are disposed in parallel and the arms are disposed to be orthogonal to the first hinges and the second hinges.

10. The angular velocity sensor of claim 6, wherein a connection direction in which the first hinges respectively connect to the first mass body and the second mass body is orthogonal to a direction in which a flexible connector of the second flexible connector system connects the first frame and the second frame.

11. The angular velocity sensor of claim 1, wherein the second flexible connector system includes a first flexible connector connecting the first frame and the second frame and is configured as a beam so as to enable a bending displacement of the first frame, with respect to the second frame, and includes a second flexible connector connecting the first frame and the second frame and is configured as a hinge so as to enable a twisting displacement of the first frame, relative to the second frame.

12. The angular velocity sensor of claim 1, wherein the first mass body and the second mass body are symmetrically arranged within the first frame and disposed relative to the second flexible connector system so that the first mass body and the second mass body translate in different directions along the second axis when the first frame rotates based on the third axis.

13. The angular velocity sensor of claim 1, wherein the first axis direction is an X-axis direction, the second axis direction is a Z-axis, and the third axis direction is a Y-axis direction.

14. The angular velocity sensor of claim 13, wherein the first flexible connector system includes:
first flexible connectors configured as beams respectively connected to the first mass body and the second mass body in the Y-axis direction; and
second flexible connectors respectively connected to the first mass body and the second mass body in the X-axis direction,
wherein one of the second flexible connectors has a link structure that includes:
a first hinge including a first hinge portion connected to one of the first mass body and the second mass body in the X-axis direction;
an arm including a first side portion connected to a second hinge portion of the first hinge and extending in the Y-axis direction; and
a second hinge including a first hinge portion connected to a second side portion of the arm in the X-axis direction, and a second hinge portion arranged so as to link the second hinge to the first frame.

15. The angular velocity sensor of claim 13, wherein the first flexible connector system includes:
first flexible connectors configured as beams respectively connected to the first mass body and the second mass body in the Y-axis direction; and
second flexible connectors respectively connected to the first mass body and the second mass body in the X-axis direction,
wherein one of the second flexible connectors has a link structure that includes:
a first hinge including a first hinge portion connected to one of the first mass body and the second mass body in the X-axis direction;
an arm including a first side portion connected to a second hinge portion of the first hinge and extending in the Y-axis direction;
a second hinge including a first hinge portion connected to a second side portion of the arm in the X-axis direction; and
a fixed arm including a first side portion connected to a second hinge portion of the second hinge and a second side portion connected to the first frame in the Y-axis direction.

16. The angular velocity sensor of claim 13, wherein the second flexible connector system includes a first flexible connector configured as a beam and to connect the first frame and the second frame in the X-axis direction, and
a second flexible connector configured as a hinge and to connect the first frame and the second frame in the Y-axis direction.

17. An angular velocity sensor, comprising:
a first frame;
a first mass body and a second mass body arranged within the first frame;
a first flexible connector system connecting the first and second mass bodies and the first frame and including a sensor configured to detect displacement of at least one of the first mass body and the second mass body;

a second frame provided separate from the first frame; and a second flexible connector system connecting the first frame and the second frame and including a driver configured to drive movement of the first frame relative to the second frame, wherein the second flexible connector system flexibly connects the first frame and the second frame to enable the first frame to rotate based on a Y axis with respect to the second frame, the driver is configured to enable rotation of the first frame based on the Y axis and a surface including the Y axis is positioned to be different from a surface at which a center of gravity of the first and second mass bodies is positioned with respect to a Z-axis direction, respective centers of gravity of the first and second mass bodies are positioned on opposite sides of an axis corresponding to the rotating of the first frame on the Y axis, respectively, and the first flexible connector system flexibly connects the first and second mass bodies with the first frame to enable a translation movement of the first and second mass bodies to be made in a Z-axis direction with respect to the first frame, and the first flexible connector system flexibly connects the first and second mass bodies with the first frame to enable a rotation movement of the first and second mass bodies based on the X axis with respect to the first frame.

18. The angular velocity sensor of claim 17, wherein the first flexible connector system includes a hinge and an arm, and the hinge is formed in a plane substantially parallel with an XZ plane and the arm has a length of a Y direction.

19. The angular velocity sensor of claim 17, wherein the first flexible connector system includes a membrane and the membrane is formed in a plane substantially parallel with an XY plane and is positioned to be adjacent to the XY plane.

20. The angular velocity sensor of claim 17, wherein the second flexible connector system includes a hinge and the hinge is formed in a plane substantially parallel with a YZ plane and is positioned to be adjacent to the YZ plane.

21. The angular velocity sensor of claim 17, wherein the first flexible connector system includes a membrane, and the membrane is formed in a plane substantially parallel with an XY plane and positioned to be adjacent to the XY plane.

22. The angular velocity sensor of claim 17, wherein the sensor is configured to detect an angular velocity rotation based on the Y axis from a translation displacement of the first and second mass bodies in the Z-axis direction and detect angular velocities of rotations based on the X axis and the Z axis from rotation displacement of the first and second mass bodies based on the X axis.

23. The angular velocity sensor of claim 17, wherein the first flexible connector system includes plural sensors, the sensors being positioned at opposing positions in the first frame with respect to the X axis.

24. The angular velocity sensor of claim 18, wherein the first flexible connector system further includes a coupling hinge connecting the first mass body and the second mass body, and the coupling hinge limits a relative translation displacement of the first mass body and the second mass body with respect to the Z-axis direction.

25. The angular velocity sensor of claim 24, wherein the coupling hinge is formed in a plane parallel with an XZ plane.

26. The angular velocity sensor of claim 24, wherein the coupling hinge connects the first mass body and the second mass body so that the first mass body and the second mass body are relatively displaced based on the X axis.

27. The angular velocity sensor of claim 17, wherein the first flexible connector system limits translation movement of the first and second mass bodies in the X-axis direction and the Y-axis direction with respect to the second frame and limits rotation movement of the first and second mass bodies based on the Y axis and the Z axis.

28. The angular velocity sensor of claim 17, wherein the second flexible connector system limits translation movement of the first frame in the X, Y, and Z axe-directions with respect to the second frame and limits rotation movement of the first frame based on the X axis and the Y axis.

* * * * *